United States Patent [19]

Robinson et al.

[11] 4,261,043

[45] Apr. 7, 1981

[54] COEFFICIENT EXTRAPOLATOR FOR THE HAAR, WALSH, AND HADAMARD DOMAINS

[75] Inventors: Guner S. Robinson, Los Angeles; James J. Reis, La Palma, both of Calif.

[73] Assignee: Northrop Corporation, Los Angeles, Calif.

[21] Appl. No.: 69,271

[22] Filed: Aug. 24, 1979

[51] Int. Cl.³ ................. G06F 15/332; G06F 15/353; H04N 7/12
[52] U.S. Cl. .................................. 364/725; 358/133; 358/260; 364/723; 364/727
[58] Field of Search ............... 364/725, 726, 727, 723; 358/133, 135, 136, 138, 260

[56] References Cited

U.S. PATENT DOCUMENTS

| | | | |
|---|---|---|---|
| 3,775,602 | 11/1973 | Alexandridis et al. | 364/727 |
| 3,920,974 | 11/1975 | Means | 364/725 |
| 4,055,756 | 10/1977 | Jolivet et al. | 364/727 X |
| 4,189,748 | 2/1980 | Reis | 358/133 |

Primary Examiner—Jerry Smith
Attorney, Agent, or Firm—Edward A. Sokolski

[57] ABSTRACT

In a data compression system utilizing the Haar, Walsh or Hadamard transformation, a machine which operates in the transform domain to obtain approximations to the higher order transform coefficients by means of extrapolation from lower order transform coefficients. The extrapolation of the higher order transform coefficients is approximately equivalent to either a linear or to a quadratic interpolation within the spatial or time domain.

4 Claims, 5 Drawing Figures

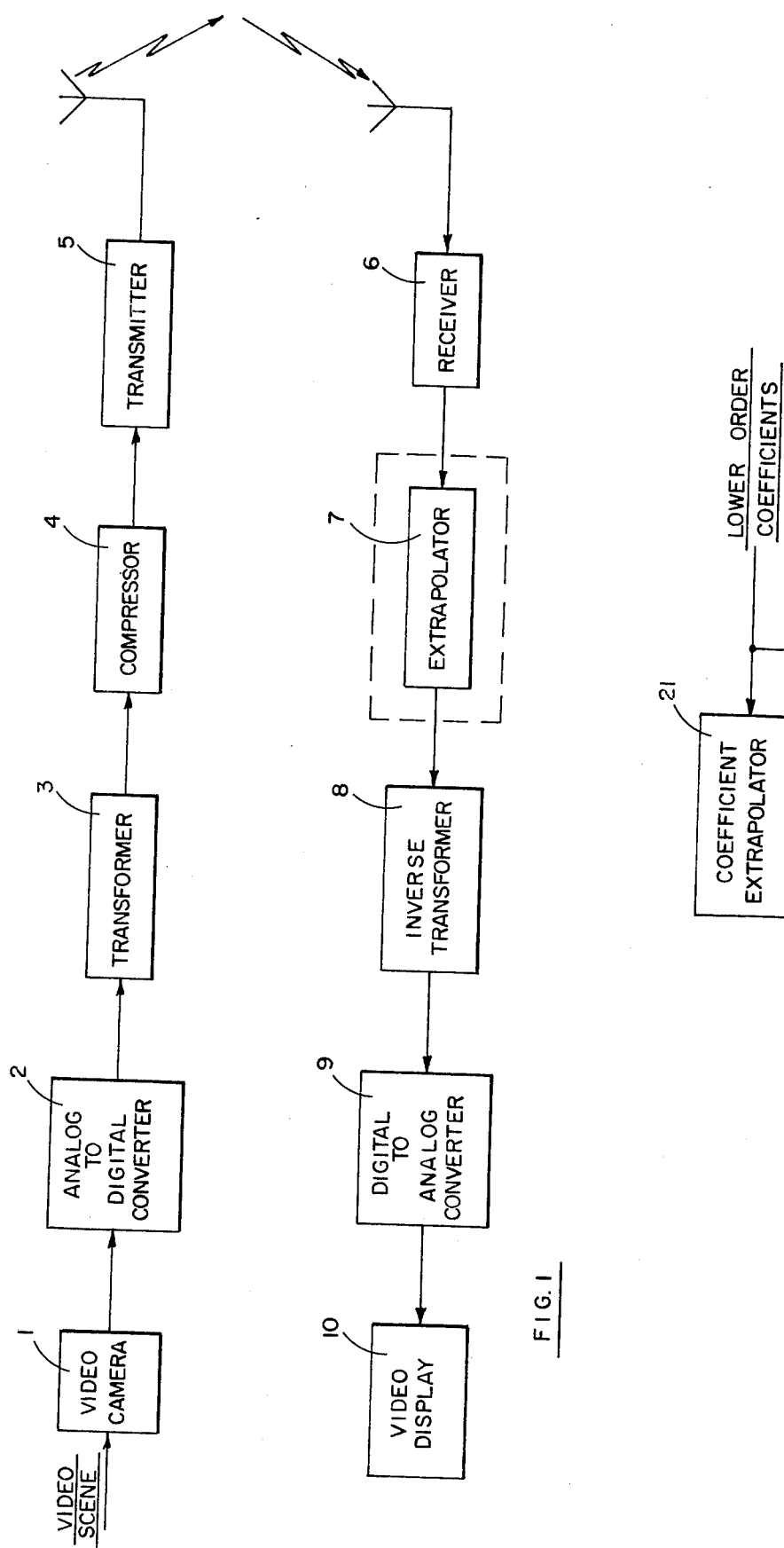

4,261,043

COEFFICIENT EXTRAPOLATOR FOR THE HAAR, WALSH, AND HADAMARD DOMAINS

BACKGROUND OF THE INVENTION

1. Field of the Invention

This invention relates to video data processing and compression systems, and more particularly to such a system which employs a one- or two-dimensional fast tranformation such as the Haar, Walsh, or Hadamard transformation for data compression. In particular, this invention relates to the extrapolation in the transform domain of higher order transform coefficients, which otherwise are not present in the output of the compression system, from the lower order transform coefficients that are output by the compression system.

2. Description of the Prior Art

Various methods have been developed for reducing the redundancy present in video data so that the data which must be transmitted in order to communicate the video data can be compressed or reduced. Many of these systems operate by means of mathematical transformations. See, for instance, "A Method and Apparatus for Implementing a Processor Based on the Rationalized Haar Transform for the Purpose of Real Time Compression of Video Data", Patent Application Ser. No. 673,799.

Prior patents such as the Discrete Cosine Transform Signal Processor, U.S. Pat No. 3,920,974, have dealt with means for mechanizing a class of transforms for processing video data, usually for the purpose of data compression. U.S. Pat. No. 3,617,716, Method and Arrangement for Extrapolation of Continuous Function, concerned means for extrapolating or predicting future values of a measurable function by operations of the function in the time domain.

BRIEF SUMMARY OF THE INVENTION

This invention operates on one- or two-dimensional video data which has been subjected to a one- or two-dimensional Haar, Walsh or Hadamard transformation. A general class of transforms, which includes the Haar, Walsh and Hadamard transformations, is described in U.S. Pat. No. 3,981,443. The invention disclosed herein extrapolates higher order transform coefficients by operating on the lower order transform coefficients in the transform domain. The higher order coefficients are calculated in terms of simple arithmetic sums of certain of the lower order coefficients. The extrapolation of the higher order coefficients in the transform domain is the approximate equivalent of a linear or a quadratic interpolation of the digital video signal in the time domain between data points.

BRIEF DESCRIPTION OF THE DRAWINGS

FIG. 1 is a block diagram of a typical data compression system which utilizes the invention;
FIG. 2 is a block diagram of the invention.

DETAILED DESCRIPTION

Figure 3:
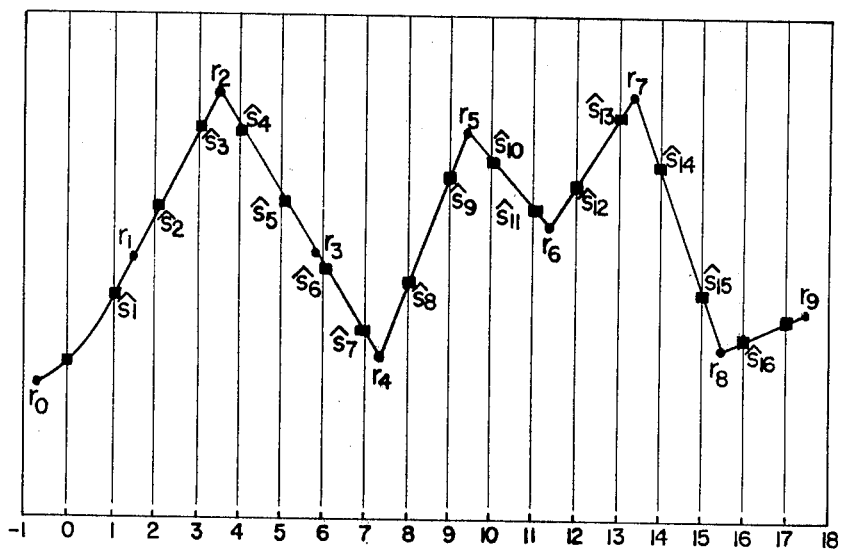
FIG. 3 is an illustration of linear extrapolation.

FIG. 1 contains the block diagram of a typical data compression transmission and reception system. Analog video data from video camera 1 is converted to digital data by the analog-to-digital converter 2. The stream of digital data from the analog-to digital converter 2 is separated into sequential groups. Each group then is transformed by transformer 3 into corresponding sets of transform coefficients. The rate at which transform coefficients are passed on to the transmitter 5 normally is limited to a predetermined rate, either by the rate at which transform coefficients are output by the transformer 3 or by the operation of compressor 4 which usually selects only the lower order coefficeints for transmission. In some cases, certain of the higher order transform coefficients that are significant in magnitude may also be selected by the compressor for transmission. See e.g. U.S. Pat. No. 4,189,748.

The transform coefficients output by the compressor 4 then are transmitted by transmitter 5 and received by receiver 6. In the prior art, the transform coefficients received by receiver 6 then are inverse transformed by inverse transformer 8. In certain of the prior art where higher order coefficients are received, a larger array of transform coefficients is inverse transformed by inverse transformer 8. However, in the prior art, the larger array contains non-zero values only for the lower order coefficients and for those selected higher order coefficients received by the receiver 6. See e.g. U.S. Pat. No. 4,189,748. In the prior art, the higher order coefficients that are not received are replaced by zeroes in the array before retransformation. The output of inverse transformer 8 passes through digital-to-analog converter 9 which converts the digital numbers to analog form which analog signal is then displayed on video displayer 10. This invention which is the extrapolator 7, operates on the output of receiver 6 in the transform domain to obtain approximations to the higher order coefficients, that have not been received by reciever 6, by means of extrapolation from the lower order coefficients which have been received by receiver 6.

FIG. 2 illustrates in more detail the operation of extrapolator 7. Lower order transform coefficients are input to the coefficient extrapolator 21 and to the matrix enlarger 22. The coefficient extrapolator 21 operates on the lower order transform coefficients which are passed on to the matrix enlarger 22. The matrix enlarger 22 combines the higher order transform coefficients with the lower order transform coefficients to create a matrix of transform coefficients containing both the higher and the lower order terms which then is output to the inverse transformer 8.

The operation of the system of this invention, and in particular the operation of coefficient extrapolator 21, is illustrated here first by its application to a system which utilizes a one-dimensional discrete Haar transformation.

One-Dimensional Haar Transform Extrapolation

The one-dimensional Haar transform coefficients $C = (c_1, c_2 \ldots, c_{N-1})$ corresponding to a data or signal vector $X = (s_1, s_2 \ldots, s_{N-1})$ can be computed from the following matrix relationship:

$$C = 1/N H_N S \qquad (1)$$

where $H_N$ is the $N \times N$ Haar transformation matrix and $N$ is a power of 2. The inverse Haar transform operation is expressed in matrix form as $$S = H_N{-1} C \qquad (2)$$

where $H_N^{-1}C$ is the inverse Haar transform matrix. The Haar transformation is described in some detail in patent application Ser. No. 673,799.

For N=16, the Haar transform and its relation to the signal data, $S_1-S_{16}$, and the transform coefficients $c_1-c_{16}$, is shown below:

$$\frac{1}{16}\begin{bmatrix} 1 & 1 & 1 & 1 & 1 & 1 & 1 & 1 & 1 & 1 & 1 & 1 & 1 & 1 & 1 & 1 \\ 1 & 1 & 1 & 1 & 1 & 1 & 1 & 1 & -1 & -1 & -1 & -1 & -1 & -1 & -1 & -1 \\ 1 & 1 & 1 & 1 & -1 & -1 & -1 & -1 & . & . & . & . & . & . & . & . \\ . & . & . & . & . & . & . & . & 1 & 1 & 1 & 1 & -1 & -1 & -1 & -1 \\ 1 & 1 & -1 & -1 & . & . & . & . & . & . & . & . & . & . & . & . \\ . & . & . & . & 1 & 1 & -1 & -1 & . & . & . & . & . & . & . & . \\ . & . & . & . & . & . & . & . & 1 & 1 & -1 & -1 & . & . & . & . \\ . & . & . & . & . & . & . & . & . & . & . & . & 1 & 1 & -1 & -1 \\ 1 & -1 & . & . & . & . & . & . & . & . & . & . & . & . & . & . \\ . & . & 1 & -1 & . & . & . & . & . & . & . & . & . & . & . & . \\ . & . & . & . & 1 & -1 & . & . & . & . & . & . & . & . & . & . \\ . & . & . & . & . & . & 1 & -1 & . & . & . & . & . & . & . & . \\ . & . & . & . & . & . & . & . & 1 & -1 & . & . & . & . & . & . \\ . & . & . & . & . & . & . & . & . & . & 1 & -1 & . & . & . & . \\ . & . & . & . & . & . & . & . & . & . & . & . & 1 & -1 & . & . \\ . & . & . & . & . & . & . & . & . & . & . & . & . & . & 1 & -1 \end{bmatrix} \begin{bmatrix} s_1 \\ s_2 \\ s_3 \\ s_4 \\ s_5 \\ s_6 \\ s_7 \\ s_8 \\ s_9 \\ s_{10} \\ s_{11} \\ s_{12} \\ s_{13} \\ s_{14} \\ s_{15} \\ s_{16} \end{bmatrix} = \begin{bmatrix} c_1 \\ c_2 \\ c_3 \\ c_4 \\ c_5 \\ c_6 \\ c_7 \\ c_8 \\ c_9 \\ c_{10} \\ c_{11} \\ c_{12} \\ c_{13} \\ c_{14} \\ c_{15} \\ c_{16} \end{bmatrix} \xrightarrow{\substack{\text{Band} \\ \text{Limit} \\ \text{in the} \\ \text{Haar} \\ \text{domain}}} \begin{bmatrix} c_1 \\ c_2 \\ c_3 \\ c_4 \\ c_5 \\ c_6 \\ c_7 \\ c_8 \\ 0 \\ 0 \\ 0 \\ 0 \\ 0 \\ 0 \\ 0 \\ 0 \end{bmatrix} \quad (3)$$

where the "dots" in the matrix represent "0'" s.

In matrix notation equation (3) is written as:

$$1/N H_N S = C \quad (4)$$

In a typical data compression system, the compressor 4, in FIG. 1, operates to remove all or most of the higher order transform coefficients $c_9-c_{16}$. If the transform coefficients received by receiver 6 of FIG. 1 are limited to $c_1-c_8$, then the system of this invention is used to extrapolate values for the transform coefficients $c_9-c_{16}$ from the lower order coefficients $c_1-c_8$ by application of either of the two sets of equations which give the higher order coefficients in terms of the lower and which are presented in Table 1. In applications where certain of the higher order terms are received by receiver 6, the received values would be used in place of the extrapolated values for those certain higher order coefficients.

with the extrapolated coefficients $c_9-c_{16}$ (provided by extrapolator 21) to yield the required sixteen elements which are then processed by the inverse transformer 8 of FIG. 1. A coefficient extrapolator which utilizes either equation set 1 or equation set 2 in Table I is referred to herein as utilizing "linear extrapolation".

Matrix enlarger 22 is an array of registers of memory locations sufficiently large to hold the additional extrapolated coefficients. Typically, this enlarger is incorporated as additional sequential memory locations which operates in the same manner as the memory storage of the non-extrapolated coefficients; indeed, the matrix enlarger merely provides a means for storing non-zero coefficient values into storage elements already required by the N-point inverse transformer 8.

That the equations 1 and 2 for the higher order transform coefficients correspond to linear interpolation in the time domain can be shown by the following mathematical derivation. Referring now to matrix equation 3, the coefficients $c_9-c_{16}$ are first setequal to zero, as would be the case where only $c_1-c_8$ were received by reciever 6 of FIG. 1. Now consider taking the N/2 point inverse Haar transform of the band-limited signal. Let this signal vector $R=(r_1..., r_{N/2})$. This operation can be expressed by the matrix

TABLE I

| Extrapolated Coefficient | Equations 1 | Equations 2 |
|---|---|---|
| $\hat{c}_9$ | $\frac{c_5}{4}$ | $\frac{c_5}{4}$ |
| $\hat{c}_{10}$ | $\frac{c_5}{4}$ | $\frac{c_3 - c_5 - c_6}{8}$ |
| $\hat{c}_{11}$ | $\frac{c_3 - c_5 - c_6}{8}$ | $\frac{c_6}{4}$ |
| $\hat{c}_{12}$ | $\frac{c_6}{4}$ | $\frac{c_2 - c_3 - c_4}{16} - \frac{c_6 + c_7}{8}$ |
| $\hat{c}_{13}$ | $\frac{c_2 - c_3 - c_4}{16} - \frac{c_6 + c_7}{8}$ | $\frac{c_7}{4}$ |
| $\hat{c}_{14}$ | $\frac{c_7}{4}$ | $\frac{c_4 - c_7 - c_8}{8}$ |
| $\hat{c}_{15}$ | $\frac{c_4 - c_7 - c_8}{8}$ | $\frac{c_8}{4}$ |
| $\hat{c}_{16}$ | $\frac{c_8}{4}$ | $\frac{c_8}{4}$ |

Either of these sets of equations corresponds approximately to the linear interpolation of the output video data in the time domain between data points. The computations represented by equations 1 or 2 in Table I are performed by coefficients extrapolator 21. The matrix englarger 22 combines the original coefficients $c_1-c_8$ $$H_{N/2}^{-1} C_{N/2} = R \quad (5)$$

where $C_{N/2}$ is the first half of the coefficient vector C. As an example, equation (5) is given explicitly in equation (6) for N=16.

$$\begin{bmatrix} 1 & 1 & 2 & . & 4 & . & . & . \\ 1 & 1 & 2 & . & -4 & . & . & . \\ 1 & 1 & -2 & . & . & 4 & . & . \\ 1 & 1 & -2 & . & . & -4 & . & . \\ 1 & -1 & . & 2 & . & . & 4 & . \\ 1 & -1 & . & 2 & . & . & -4 & . \\ 1 & -1 & . & -2 & . & . & . & 4 \\ 1 & -1 & . & -2 & . & . & . & -4 \end{bmatrix} \begin{bmatrix} c_1 \\ c_2 \\ c_3 \\ c_4 \\ c_5 \\ c_6 \\ c_7 \\ c_8 \end{bmatrix} = \begin{bmatrix} r_1 \\ r_2 \\ r_3 \\ r_4 \\ r_5 \\ r_6 \\ r_7 \\ r_8 \end{bmatrix} \quad (6)$$

Equation (5) can be used to derive the components of the R vector in terms of the first half of the coefficient vector C, for any N which is a power of 2.
That is $$r_1 = c_1 + \left[ \sum_{i=1}^{\log_2 N - 2} 2^{i-1} c(2^{i-1} + 1) \right] + \frac{N}{4} c_{\frac{N}{4}+1} \quad (7)$$

$$r_2 = c_1 + \left[ \sum_{i=1}^{\log_2 N - 2} 2^{i-1} c(2^{i-1} + 1) \right] - \frac{N}{4} c_{\frac{N}{4}+1}$$

etc.

Equation (7) can be verified for N/2=8, using the example in Equation (6).

Now consider taking the inverse transform of the coefficient vector C to obtain the signal vector S, as given by Equation (1) and shown explicitly in Equation (8) for N=16 where S includes values at 16 data points.

$$\begin{bmatrix} 1 & 1 & 2 & . & 4 & . & . & . & 8 & . & . & . & . & . & . & . \\ 1 & 1 & 2 & . & 4 & . & . & . & -8 & . & . & . & . & . & . & . \\ 1 & 1 & 2 & . & -4 & . & . & . & . & 8 & . & . & . & . & . & . \\ 1 & 1 & 2 & . & -4 & . & . & . & . & -8 & . & . & . & . & . & . \\ 1 & 1 & -2 & . & . & 4 & . & . & . & . & 8 & . & . & . & . & . \\ 1 & 1 & -2 & . & . & 4 & . & . & . & . & -8 & . & . & . & . & . \\ 1 & 1 & -2 & . & . & -4 & . & . & . & . & . & 8 & . & . & . & . \\ 1 & 1 & -2 & . & . & -4 & . & . & . & . & . & -8 & . & . & . & . \\ 1 & -1 & . & 2 & . & . & 4 & . & . & . & . & . & 8 & . & . & . \\ 1 & -1 & . & 2 & . & . & 4 & . & . & . & . & . & -8 & . & . & . \\ 1 & -1 & . & 2 & . & . & -4 & . & . & . & . & . & . & 8 & . & . \\ 1 & -1 & . & 2 & . & . & -4 & . & . & . & . & . & . & -8 & . & . \\ 1 & -1 & . & -2 & . & . & . & 4 & . & . & . & . & . & . & 8 & . \\ 1 & -1 & . & -2 & . & . & . & 4 & . & . & . & . & . & . & -8 & . \\ 1 & -1 & . & -2 & . & . & . & -4 & . & . & . & . & . & . & . & 8 \\ 1 & -1 & . & -2 & . & . & . & -4 & . & . & . & . & . & . & . & -8 \end{bmatrix} \begin{bmatrix} c_1 \\ c_2 \\ c_3 \\ c_4 \\ c_5 \\ c_6 \\ c_7 \\ c_8 \\ c_9 \\ c_{10} \\ c_{11} \\ c_{12} \\ c_{13} \\ c_{14} \\ c_{15} \\ c_{16} \end{bmatrix} = \begin{bmatrix} s_1 \\ s_2 \\ s_3 \\ s_4 \\ s_5 \\ s_6 \\ s_7 \\ s_8 \\ s_9 \\ s_{10} \\ s_{11} \\ s_{12} \\ s_{13} \\ s_{14} \\ s_{15} \\ s_{16} \end{bmatrix} \quad (8)$$

Now observe that the true signal values, S, are linear combinations of only certain groups of coefficients, and are related to the R coefficients of Equation (6) as shown below in Equation (9).

$$s_1 = c_1 + c_2 + 2c_3 + 4c_5 + 8c_9 = r_1 + 8c_9 \quad (9)$$
$$s_2 = c_1 + c_2 + 2c_3 + 4c_5 - 8c_9 = r_1 - 8c_9$$
$$s_3 = c_1 + c_2 + 2c_3 - 4c_5 + 8c_{10} = r_2 + 8c_{10}$$
$$s_4 = c_1 + c_2 + 2c_3 - 4c_5 - 8c_{10} = r_2 - 8c_{10}, \text{ etc.}$$

The general relationship between $R=(r_1, \ldots, r_{N/2})$ and $S=(s_1, s_2, \ldots, s_N)$ is given by Equation (10).

$$s_{2i-1} = r_i + \frac{N}{2} c_{N/2+i} \quad (10)$$
$$s_{2i} = r_i - \frac{N}{2} c_{N/2+i}$$
$$i = 1, 2, \ldots, N/2.$$

Equation (10) clearly shows that the components of the band-limited reconstruction vector R, when $c_9 - c_{16}$ are set equal to zero, are equal to the averages of the two consecutive signal components because:

$$r_i = \frac{s_{2i-1} + s_{2i}}{2} \quad (11)$$
$$i = 1, 2, \ldots, N/2.$$

The inverse transform of the band-limited coefficient vector is the replication of the R vector.

The R to S relationship given by equation (10) shows that coefficient $c_{N/2-1}$ depends only on $r_1$, $s_1$ and $s_2$. Therefore, $c_{N/2+1}$ can be derived such that the two-point interpolation values $\hat{s}_1, \hat{s}_2$, etc. obtained from $r_1$ and $r_2$ satisfy equation (10). Two-point interpolation of the vector R is shown graphically in FIG. 3, where the interpolated values are denoted by " ̂ ". The weights used in the interpolation are determined such that $\hat{s}_2$ and $\hat{s}_3$ fall on the one-quarter and the three-quarter points of the straight line connecting $r_1$ and $r_2$. Equation (12) gives the interpolated points in terms of signal data points and transform coefficients for N=16.

$$s_1 = \frac{5}{4} r_1 - \frac{1}{4} r_2 \approx \hat{s}_1 = r_1 + 8 c_9 \quad (12)$$
$$s_2 = \frac{3}{4} r_1 + \frac{1}{4} r_2 \approx \hat{s}_2 = r_1 - 8 c_9$$
$$s_3 = \frac{1}{4} r_1 + \frac{3}{4} r_2 \approx \hat{s}_3 = r_2 + 8 c_{10}$$
$$s_4 = \frac{3}{4} r_2 + \frac{1}{4} r_3 \approx \hat{s}_4 = r_2 - 8 c_{10}$$
$$s_5 = \frac{1}{4} r_2 + \frac{3}{4} r_3 \approx \hat{s}_5 = r_3 + 8 c_{11}$$

.
.
.

$$s_{14} = \frac{3}{4} r_7 + \frac{1}{4} r_8 \approx \hat{s}_{14} = r_7 - 8 c_{15}$$
$$s_{15} = \frac{1}{4} r_7 + \frac{3}{4} r_8 \approx \hat{s}_{15} = r_8 + 8 c_{16}$$
$$s_{16} = \frac{5}{4} r_8 - \frac{1}{4} r_7 \approx \hat{s}_{16} = r_8 - 8 c_{16}$$

Approximation of the two-point interpolation vector $\hat{S}$ with the vector S based on the transform coefficient results in two different sets of coefficients $\hat{c}_9, \hat{c}_{10}, \ldots, \hat{c}_{16}$. The solution is not unique, because $\hat{c}_{10}$ can be obtained either from $\hat{s}_3$ or $\hat{s}_4$ in equation (12). The general form of the solution for any N is the following:

Solution 1

$$\hat{c}_{N/2+1} = \hat{c}_{N/2+2} \quad (13a)$$
$$\hat{c}_{N/2+i} = (r_{i-1} - - r_i)/2N \quad i = 2, 3, \ldots, N/2$$

Solution 2

$$\hat{c}_{N/2+i} = (r_{i-1} - r_i)/2N \quad i = 1, 2, \ldots, N/2 - 1 \quad (13b)$$
$$\hat{c}_N = c_{N-1}$$

For $N = 16$, these two sets of solutions result in those equations given in Table I, when the $r$'s are expressed in terms of the first half of the coefficients as given by Equation (7). Although simple forms of formulas for linear extrapolation in the transform domain can also be obtained for Walsh and Hadamard transformations, they are not included in this invention because, as is disclosed below, the formulas for extrapolation for these transforms as well as for the Haar transform, which are approximately equivalent to quadratic interpolation in the time or spatial domain, are relatively simple, provide more accurate extrapolation, and hence would normally be used.

Extrapolation in the Haar Domain Corresponding to Quadratic Interpolation in the Time Domain If the two solutions for the higher order transform coefficients in terms of the lower order coefficients, as given in Table I, are added together and divided by 2, the composite of the solutions, as given below in Table II, corresponds to the quadratic interpolation of the signal in the time domain.

TABLE II

| Quadratic Solution |
|---|
| $\hat{c}_9 = \dfrac{c_5}{4}$ |
| $\hat{c}_{10} = \dfrac{c_3 + (c_5 - c_6)}{16}$ |
| $\hat{c}_{11} = \dfrac{c_3 - (c_5 - c_6)}{16}$ |
| $\hat{c}_{12} = \dfrac{c_2 - (c_3 + c_4)}{32} + \dfrac{(c_6 - c_7)}{16}$ |
| $\hat{c}_{13} = \dfrac{c_2 - (c_3 + c_4)}{32} - \dfrac{(c_6 - c_7)}{16}$ |
| $\hat{c}_{14} = \dfrac{c_4 + (c_7 - c_8)}{16}$ |
| $\hat{c}_{15} = \dfrac{c_4 - (c_7 - c_8)}{16}$ |
| $\hat{c}_{16} = \dfrac{c_8}{4}$ |

Thus, for "quadratic" extrapolation, the coefficient extrapolator 21 calculates the higher order coefficients in terms of the lower order coefficients in the manner indicated by the equations in Table II, and this process is referred to herein as "quadratic interpolation". That the equations given above correspond approximately to a quadratic interpolation in the time or spatial domain for the Haar transforms can be demonstrated in a manner similar to that shown below for deriving the extrapolation equations for the Walsh and Hadamard transforms which correspond to quadratic interpolation.

Quadratic Extrapolation for Walsh-Hadamard Transformations

Figure 4:
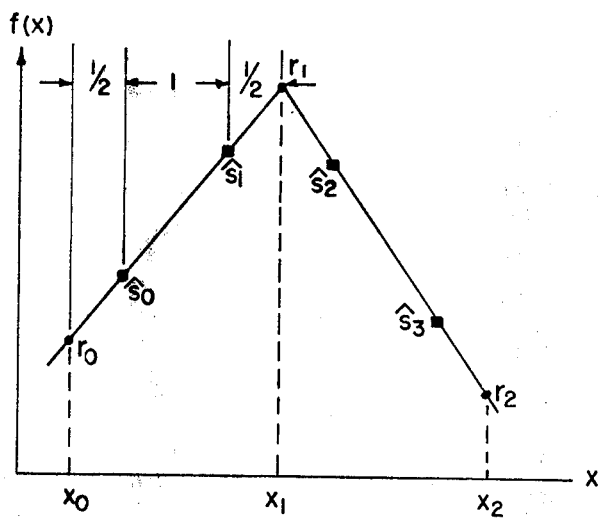
FIG. 4 illustrates quadratic interpolation.

Quadratic interpolation in the time or spatial domain can be performed by the second order Lagrangian interpolating polynomial shown in equation (14) and as illustrated in FIG. 4.

$$P_2(x) = f(x_0)L_0 + f(x_1)L_1 + f(x_2)L_2 \quad (14)$$

where $$L_0 = \dfrac{(x - x_1)(x - x_2)}{(x_0 - x_1)(x_0 - x_2)} \quad (15a)$$
$$L_1 = \dfrac{(x - x_0)(x - x_2)}{(x_1 - x_0)(x_1 - x_2)}$$
$$L_2 = \dfrac{(x - x_0)(x - x_1)}{(x_2 - x_0)(x_2 - x_1)}$$

For $x_0 < x < x_2$
and where $$r_0 = f(x_0) \quad (15b)$$
$$r_1 = f(x_1)$$
$$r_2 = f(x_2)$$

The $r_i$ points shown in FIG. 4 correspond to the pre-extra-polated waveform and the $\hat{s}_i$ points correspond to the desired interpolated waveform.

Upon substituting the specified ordinant values into Equation 14, we find $\hat{s}_i$ to be given by:

$$\left.\begin{array}{l}\hat{s}_i = -\dfrac{5}{32}r_{i-1} + \dfrac{15}{16}r_i - \dfrac{3}{32}r_{i+1} = r_i + t_i \\ \hat{s}_{i+1} = -\dfrac{3}{32}r_{i-1} + \dfrac{15}{16}r_i + \dfrac{5}{32}r_{i+1} = r_i - t_i\end{array}\right\} i = 1, 3, 5, \quad (16)$$

where $t_i$ is the extrapolated component to be determined, and $r_i$ are the components of the band-limited reconstruction vector as in the case of the Haar transform. (Equation (16) is the Walsh-Hadamard domain equivalent of Equation (9). Equation (16) can be solved for $t_i$, yielding:

$$t_i = \dfrac{r_{i-1} - r_{i+1}}{8}, \quad i = 1, 2, 3, \quad (17)$$

Similar to the Haar transform, the one-dimensional Walsh-Hadamard transform pair can be defined by the matrix equations:

$$C = \dfrac{1}{N} W_N S \quad (18a)$$
$$S = W_N C \quad (18b)$$

where $C$ = Walsh-Hadamard transform Coefficient vector of size $N \times 1$
$W_N$ = Walsh-Hadamard matrix of size $N \times N$
$S$ = Input signal vector being transformed
$N$ = Size of transform By way of example, $w_{16}$ is shown explicity in Equation (19).

$$w_{16} = \begin{vmatrix} 1 & 1 & 1 & 1 & 1 & 1 & 1 & 1 & 1 & 1 & 1 & 1 & 1 & 1 & 1 & 1 \\ 1 & 1 & 1 & 1 & 1 & 1 & 1 & 1 & -1 & -1 & -1 & -1 & -1 & -1 & -1 & -1 \\ 1 & 1 & 1 & 1 & -1 & -1 & -1 & -1 & -1 & -1 & -1 & -1 & 1 & 1 & 1 & 1 \\ 1 & 1 & 1 & 1 & -1 & -1 & -1 & -1 & 1 & 1 & 1 & 1 & -1 & -1 & -1 & -1 \\ 1 & 1 & -1 & -1 & -1 & -1 & 1 & 1 & 1 & 1 & -1 & -1 & -1 & -1 & 1 & 1 \\ 1 & 1 & -1 & -1 & -1 & -1 & 1 & 1 & -1 & -1 & 1 & 1 & 1 & 1 & -1 & -1 \\ 1 & 1 & -1 & -1 & 1 & 1 & -1 & -1 & -1 & -1 & 1 & 1 & -1 & -1 & 1 & 1 \\ 1 & 1 & -1 & -1 & 1 & 1 & -1 & -1 & 1 & 1 & -1 & -1 & 1 & 1 & -1 & -1 \\ 1 & -1 & -1 & 1 & 1 & -1 & -1 & 1 & 1 & -1 & -1 & 1 & 1 & -1 & -1 & 1 \\ 1 & -1 & -1 & 1 & 1 & -1 & -1 & 1 & -1 & 1 & 1 & -1 & -1 & 1 & 1 & -1 \\ 1 & -1 & -1 & 1 & -1 & 1 & 1 & -1 & -1 & 1 & 1 & -1 & 1 & -1 & -1 & 1 \\ 1 & -1 & -1 & 1 & -1 & 1 & 1 & -1 & 1 & -1 & -1 & 1 & -1 & 1 & 1 & -1 \\ 1 & -1 & 1 & -1 & -1 & 1 & -1 & 1 & 1 & -1 & 1 & -1 & -1 & 1 & -1 & 1 \\ 1 & -1 & 1 & -1 & -1 & 1 & -1 & 1 & -1 & 1 & -1 & 1 & 1 & -1 & 1 & -1 \\ 1 & -1 & 1 & -1 & 1 & -1 & 1 & -1 & -1 & 1 & -1 & 1 & -1 & 1 & -1 & 1 \\ 1 & -1 & 1 & -1 & 1 & -1 & 1 & -1 & 1 & -1 & 1 & -1 & 1 & -1 & 1 & -1 \end{vmatrix} \quad (19)$$

The $t_i$'s of Equation (17) correspond to the contributions of the last $N/2$ columns of $W_N$ during the inverse transformation. (The data compression process has caused the last $N/2$ rows of $t_N$ to be zero.) The $r_i$ terms of Equation 17 correspond to the first $N/2$ columns of $W_N$. Since the $r_i$ terms are completely expressible as linear combinations of known coefficients, we can, through Equation (17), express the unknown coefficients, $t_i$, as a linear combination of known coefficients. This process is shown explicitly in Equation (20) for a 16 point transform, assuming linear interpolation across the boundaries of the finite waveform.

$$\begin{vmatrix} 2t_1 \\ t_2 \\ t_3 \\ t_4 \\ t_5 \\ t_6 \\ t_7 \\ 2t_8 \end{vmatrix} = \frac{1}{4} \begin{vmatrix} . & . & . & . & 1 & 1 & 1 & 1 \\ . & . & 1 & 1 & 1 & 1 & . & . \\ . & . & 1 & 1 & -1 & -1 & . & . \\ . & 1 & . & -1 & -1 & . & 1 & . \\ . & 1 & . & -1 & 1 & . & -1 & . \\ . & . & -1 & 1 & 1 & -1 & . & . \\ . & . & -1 & 1 & -1 & 1 & . & . \\ . & . & . & . & -1 & 1 & -1 & 1 \end{vmatrix} \begin{vmatrix} c_1 \\ c_2 \\ c_3 \\ c_4 \\ c_5 \\ c_6 \\ c_7 \\ c_8 \end{vmatrix} \quad (20)$$

By inspection of Equation (19), the vector $T_8 = (t_1, t_2, \ldots, t_8)$ can be expressed in terms of the extrapolated coefficient vector $(\hat{c}_{16}, \hat{c}_{15}, \ldots, \hat{c}_9)$ as in Equation (21a).

$$T_8 = W_8 C_8 \quad (21a)$$

Equation (21a), as given more explicitly in Equation (21b), shows that the coefficients to be estimated can be obtained by inverse transform of the vector $T_8$. It should be noted that the estimated coefficients come out in reverse order.

$$\begin{vmatrix} t_1 \\ t_2 \\ t_3 \\ t_4 \\ t_5 \\ t_6 \\ t_7 \\ t_8 \end{vmatrix} = \begin{vmatrix} 1 & 1 & 1 & 1 & 1 & 1 & 1 & 1 \\ 1 & 1 & 1 & 1 & -1 & -1 & -1 & -1 \\ 1 & 1 & -1 & -1 & -1 & -1 & 1 & 1 \\ 1 & 1 & -1 & -1 & 1 & 1 & -1 & -1 \\ 1 & -1 & -1 & 1 & 1 & -1 & -1 & 1 \\ 1 & -1 & -1 & 1 & -1 & 1 & 1 & -1 \\ 1 & -1 & 1 & -1 & -1 & 1 & -1 & 1 \\ 1 & -1 & 1 & -1 & 1 & -1 & 1 & -1 \end{vmatrix} \begin{vmatrix} \hat{c}_{16} \\ \hat{c}_{15} \\ \hat{c}_{14} \\ \hat{c}_{13} \\ \hat{c}_{12} \\ \hat{c}_{11} \\ \hat{c}_{10} \\ \hat{c}_9 \end{vmatrix} \quad (21b)$$

Due to the global nature of the Walsh-Hadamard transform, spectral extrapolation of the second half of the coefficients requires all of the first half of the coefficients. However, the form is still very simple and the procedure yields identical results of the Haar domain equivalent. As in the case of the Haar transform, the technique is stepwise iterative and thus it can easily be incorporated in a fast form for hardware implementation.

The original signal can be recovered by combining the solution to Equation (21b) (obtained by application of Equation 18) which yields $\hat{c}_9$ to $\hat{c}_{16}$ with the given coefficients $c_1$ to $c_8$, to yield a total coefficient vector of size $N=16$. Equation (18b) is applied to recover the original signal. Thus, the higher order coefficients are given in terms of the lower order coefficients by the following equation:

$$\begin{bmatrix} \hat{c}_{16} \\ \hat{c}_{15} \\ \hat{c}_{14} \\ \hat{c}_{13} \\ \hat{c}_{12} \\ \hat{c}_{11} \\ \hat{c}_{10} \\ \hat{c}_9 \end{bmatrix} = \frac{1}{4} \begin{bmatrix} 1 & 1 & 1 & 1 & 1 & 1 & 1 & 1 \\ 1 & 1 & 1 & 1 & -1 & -1 & -1 & -1 \\ 1 & 1 & -1 & -1 & -1 & -1 & 1 & 1 \\ 1 & 1 & -1 & -1 & 1 & 1 & -1 & -1 \\ 1 & -1 & -1 & 1 & 1 & -1 & -1 & 1 \\ 1 & -1 & -1 & 1 & -1 & 1 & 1 & -1 \\ 1 & -1 & 1 & -1 & -1 & 1 & -1 & 1 \\ 1 & -1 & 1 & -1 & 1 & -1 & 1 & -1 \end{bmatrix} \begin{bmatrix} 2(c_5 + c_6 + c_7 + c_8) \\ c_3 + c_4 + c_5 + c_6 \\ c_3 + c_4 - c_5 - c_6 \\ c_2 - c_4 - c_5 + c_7 \\ c_2 - c_4 + c_5 - c_7 \\ -c_3 + c_4 + c_5 - c_6 \\ -c_3 + c_4 - c_5 + c_6 \\ -2(c_5 - c_6 + c_7 - c_8) \end{bmatrix} \quad \text{Equation (22)}$$

The calculation of the higher order coefficients by means of Equation (22) is referred to herein as Walsh-Hadamard quadratic extrapolation.

Application to Two-Dimensional Transformations

Because the Haar, the Walsh, and the Hadamard transformations are linear transformations, a two-dimensional transformation in each case can be obtained by the successive application of two one-dimensional transformations. For instance, given a two-dimensional $16 \times 16$ array of video data, each of the 16 rows of data are first transformed in one dimension to obtain 16 rows of transform coefficients. The 16 rows are then transformed, 1 column at a time, to obtain the two-dimensional transformation. The extrapolation of the higher order coefficients in two-dimensions can be carried out in a similar manner, that is by performing two successive one-dimensional extrapolations.

Figure 5:
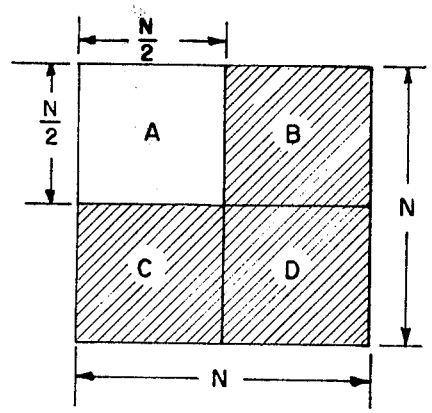
FIG. 5 illustrates the relationship between the higher order coefficients obtained by two-dimensional extrapolation to the lower order coefficients.

Referring now to FIG. 5, if only the lower order two-dimensional transform coefficients are available at the receiver, e.g. an 8×8 array occupying the area indicated by "A" in FIG. 5, the higher order coefficients in areas B, C, and D of FIG. 5 can be obtained by successive application of the extrapolation algorithm in each of the two dimensions. The higher order coefficients in area B are first obtained by the application of the one-dimensional extrapolation technique to successive rows of lower order coefficients in region A. Successive applications of the extrapolation algorithm to the columns of coefficients in areas A and B then yield the higher order coefficients in areas C and D of FIG. 5.

We claim:

1. In a data processing and compression system which utilizes the Haar, Walsh or Hadamard transformations to obtain lower and higher order transform coefficients, and extrapolator comprising:
   (a) coefficient extrapolator means for extrapolating the higher order transform coefficients from the lower order transform coefficients, and
   (b) matrix enlarger means for combining the higher order transform coefficients, produced by the coefficient extrapolator means, with the lower order transform coefficients to produce an enlarged matrix of transform coefficients containing both lower and higher order transform coefficients.

2. In a data processing and compression system which utilizes the Haar transformation to obtain lower and higher order transform coefficients, an extrapolator comprising:
   (a) a coefficient extrapolator which extrapolates the higher order transform coefficients from the lower order coefficients by means of linear extrapolation, and
   (b) matrix enlarger means for combining the higher order transform coefficients, produced by the coefficient extrapolator, with the lower order transform coefficients to produce an enlarged matrix of transform coefficients containing both lower and higher order transform coefficients.

3. In a data processing and compression system which utilizes the Walsh or Hadamard transformation to obtain lower and higher order transform coefficients, and extra polator comprising:
   (a) a coefficient extrapolator which extrapolates the higher order transform coefficients from the lower order coefficients by means of Walsh-Hadamard quadratic extrapolation , and p1 (b) matrix enlarger means for combining the higher order transform coefficients produced by the coefficient extrapolator with the lower order transform coefficients to produce an enlarged matrix of transform coefficients containing both lower and higher order transform coefficients.

4. In a data processing and compression system which utilizes the Haar transformation to obtain lower and higher order transform coefficients, an extrapolator comprising:
   (a) a coefficient extrapolator which extrapolates the higher order transform coefficients from the lower order coefficients by means of quadratic extrapolation, and
   (b) matrix enlarger means for combining the higher order transform coefficients, produced by the coefficient extrapolator, with the lower order transform coefficients to produce an enlarged matrix of transform coefficients containing both lower and higher order transform coefficients.

* * * * *